United States Patent
Hokari et al.

[11] Patent Number: 6,114,718
[45] Date of Patent: Sep. 5, 2000

[54] SOLID STATE IMAGE SENSOR AND ITS FABRICATION

[75] Inventors: Yasuaki Hokari; Chihiro Ogawa, both of Tokyo, Japan

[73] Assignee: NEC Corporation, Tokyo, Japan

[21] Appl. No.: 09/192,190

[22] Filed: Nov. 16, 1998

[30] Foreign Application Priority Data

Nov. 14, 1997 [JP] Japan ..................................... 9-313979

[51] Int. Cl.[7] ...................... H01L 29/768; H01L 27/148; H01L 31/0232
[52] U.S. Cl. .......................... 257/250; 257/221; 257/224; 257/243; 257/249; 257/435
[58] Field of Search .................................. 257/221, 224, 257/243, 249, 250, 435

[56] References Cited

U.S. PATENT DOCUMENTS

| | | | |
|---|---|---|---|
| 5,182,622 | 1/1993 | Iizuka et al. | 257/231 |
| 5,194,751 | 3/1993 | Yonemoto et al. | 257/229 |
| 5,216,489 | 6/1993 | Yonemoto et al. | 377/60 |
| 5,250,825 | 10/1993 | Negishi et al. | 257/232 |
| 5,286,990 | 2/1994 | Hynecek | 257/247 |
| 5,434,437 | 7/1995 | Itakura et al. | 257/231 |
| 5,491,512 | 2/1996 | Itakura et al. | 348/321 |
| 5,668,390 | 9/1997 | Morimoto | 257/232 |
| 5,723,884 | 3/1998 | Kim | 257/232 |

OTHER PUBLICATIONS

T. Nobusada et al., "Frame Interline Transfer CCD Sensor for HDTV Camera", *1989 IEEE International Solid–State Circuits Conference*, Feb. 15, 1989, pp. 88–89.

K. Yonemoto et al., "A 2 Million Pixel FIT–CCD Image Sensor for HDTV Camera System", *1990 IEEE International Solid–State Circuits Conference*, Feb. 16, 1990, pp. 214–215.

*Primary Examiner*—Ngân V. Ngô
*Attorney, Agent, or Firm*—Sughrue, Mion, Zinn, Macpeak & Seas, PLLC

[57] ABSTRACT

A dipping in potential well due to direct contact between transfer electrodes and metal wiring causes a drop in transfer efficiency through a CCD register. In order to eliminate or at least reduce the potential dipping, an $N^-$-type impurity layer that functions as a CCD channel is formed with $N^{--}$-type impurity regions that have impurity concentration lower than that of the $N^-$-type impurity layer. The $N^-$-type impurity regions are located below transfer electrodes in alignment with contact apertures.

5 Claims, 9 Drawing Sheets

SOLID STATE IMAGE SENSOR AND ITS FABRICATION

FIELD OF THE INVENTION

The present invention relates to solid state image sensors and a method of fabrication, and more particularly to CCD image sensors with increased transfer efficiency.

BACKGROUND OF THE INVENTION

Conventional CCD image sensors are illustrated in FIGS. 8 to 11.

FIG. 8 is a plan view showing the general configuration of a conventional two-dimensional CCD image sensor. The sensor comprises photoelectric converters, in the form of photo diodes 101, vertical registers 102, read-out gates 103, a horizontal register 104, and an output 105.

Signal charges converted by a photoelectric converter are stored for a charge storage period (for example, 1/60 seconds). The read-out gate being driven opens to read out the stored signal charges to the adjacent vertical register (see arrows A). During a horizontal blanking period, the signal charges are transferred toward the horizontal register (see arrows B). Subsequently, the horizontal register transfers the signal charges toward the output at a high speed (see arrow C) during a horizontal scanning period. The period between the first read-out of charges to the next is the charge storage period.

FIG. 9 is a plan view of a portion of conventional vertical CCD registers, which is referred to in explaining configuration of vertical CCD registers 102. Toshio NOBUSADA et al. reported on a frame interline transfer CCD image sensor that uses a poly-Si/Al double-layer transfer gate and P+floating island isolation "Frame Interline Transfer CCD sensor for HDTV Cameras" Digest of Technical Papers, pp. 88–89, IEEE International Solid-State Circuit Conference Feb. 15, 1989. The configuration illustrated is FIG. 9 is analogous to the poly-Si/Al double layer transfer gate illustrated in pp. 89 of the Digest of Technical Papers. In FIG. 9, transfer electrodes 106 are successively arranged in each vertical CCD channel (not illustrated) a short distance apart from each other to transfer signal charges. A metal wiring layer 107 is connected to the transfer gates 106 to apply drive pulses. The metal wiring layer 107 is connected to the transfer electrodes 106 via contact apertures 108. The transfer electrodes 106 of one vertical register and those of the other vertical registers are interconnected via wiring and they are dividable into a number of groups each for one line of photodiodes 101 such that each group of transfer electrodes is adapted to be subject to a train of pulses in common.

In the example shown in FIG. 9, the wiring layer 107 includes metal wires 107a, 107b, 107c and 107d, and each metal wire has one contact window or aperture 108 every four successively arranged transfer electrodes 106 belonging to one vertical register. The adjacent four metal wires 107a, 107b, 107c and 107g have contact apertures 108 opening to four different transfer electrodes 106, respectively, which are in successively arranged four lines and belong to successively arranged four vertical registers, respectively. Thus, each metal wire 107a, 107b, 107c and 107d is connected to one transfer electrode every four successively arranged transfer gates 106 of one vertical register. Four different in phase trains of pulses are applied to the metal wires 107a, 107b, 107c and 107d, respectively.

This connection between the transfer electrodes 106 and the metal wiring 107 is required to accomplish transfer of signal charges through the CCD channels at high frequency. In the example of Figure, the transfer electrodes 106 are formed of poly-Si, which has high interlayer resistance in the order of several tens Ohms. This high resistance brings about signal distortion of drive pulses if driven at a frequency exceeding 20 MHz, thus making it difficult to transfer charges. The provision of the contact apertures 108 to establish points at which the transfer electrodes 106 are connected to the metal wiring 107 is found to be effective in suppressing the signal distortion of drive pulses at transfer electrodes 106, thereby to allow pulses to be driven at a high frequency. Let us consider one group of transfer electrodes for one line of photodiodes, which are interconnected by the metal wiring. These transfer electrodes of one group are connected to a portion of the metal wiring supplied with the same pulse voltage every four CCD channels. They are subject to the same pulse voltage at intervals of several tens microns, making it possible to drive pulses at a sufficiently high frequency. In order to reduce photo-generated noise charges due to incident light to the CCG channels, a photo-shield layer is used as the metal wiring 107.

FIG. 10 is a cross section taken though the configuration of FIG. 9 along a direction of transfer of signal charges across a CCD channel through one CCD register. In FIG. 10, deposited on N-type substrate 110 is P⁻-type well 115. Deposited on the P⁻-type well 115 is N⁻-type impurity layer 116 that severs as CCD channel. A gate insulating layer 121 is deposited on the N⁻-type impurity layer 116. Poly-Si transfer electrodes, generally designated at 106, 106a, 106b, 106c and 106d are deposited on the insulating layer 121. Al wiring 107 is deposited on the insulating layer 121 over the transfer electrodes 106a, 106b, 106c and 106d and it has contact apertures 108. The contact apertures 108 are located above gate regions of transfer electrodes 106d. In FIG. 10, one in every four transfer electrodes is connected to the same Al wiring in common. That is, the transfer electrodes 106d arranged across three transfer electrodes 106a, 106b and 106c are connected to the same Al wiring 107 in common.

FIG. 11 is a plan view illustrating one unit pixel of the configuration of FIG. 9. The reference numeral 101 designates a photodiode. The reference numeral 205 designates a vertical CCD channel. The reference numeral 103 designates a read-out gate. The reference numeral 118 designates a diffusion region for separating the photodiode 111 from the CCD channel 103. The reference numerals 210 and 220 designates a first poly-Si electrode layer used as a transfer electrode and a second poly-Si electrode layer used as a transfer electrode, respectively. The reference numeral 108 designates a contact aperture used to connect the transfer electrode 220 to the Al wiring 107, not shown in FIG. 11. The CCD channel 205 separated by the diffusion region 118 allows transfer of signal charges. The contact aperture 108 is located above the gate region of the transfer electrode and on the centerline of the CCD channel 205. Kazuya YONOMOTO et al. reported on a CCD image sensor with contact apertures on the centerline of each CCD channel "A 2 Million Pixel FIT-CCD Image Sensor for HDTV Camera System" Digest of Technical Papers PP. 214–215, IEEE International Solid States Circuits Conference, Feb. 16, 1990.

The electrode configuration shown in FIG. 9 exhibits a drop in transfer efficiency down from a satisfactorily high level. This drop is derived from the provision of contact apertures because, without the provision of contact apertures, this phenomenon was not found. Specifically, it is derived from contacts between the poly-Si transfer electrodes 106 and the Al wiring 107.

Experiment was conducted with one case where contact apertures were located within active region of poly-Si gate electrode of MOS type transistor and other case where no contact apertures were located within active region of poly-Si gate electrode of MOS type transistor to compare threshold voltages with respect to the two cases. FIG. 12 shows the results of this experiment. Tungsten was used as the metal wiring. As is appreciated from FIG. 12, a drop in threshold voltage by about 1 (one) volt was observed if the contact apertures were provided. This is because potential under the transfer electrode dips at an area where the contact aperture is located, thereby to create a dipping in the potential well.

FIG. 13 illustrates distribution of potential along a cross section taken through the line X—X in FIG. 11, illustrating a dipping in potential below an area where the contact aperture is located. The dipping in the potential well will trap a portion of charges, thereby to cause a drop in transfer efficiency. It is not yet clarified what brings about such a dipping in potential at an area where a contact aperture is located. The depth of such dipping is dependent on the material used as the metal wiring. Therefore, the direct contact between the poly-Si electrode and the metal wiring is considered to play some important role in creating a dipping in potential.

Judging from this point of view, it is preferred to use a CCD register configuration as shown in FIG. 14 where no direct contact between the transfer electrode and the metal wiring is used. In FIG. 14, the same reference numerals as used in FIG. 10 are used to denote like or similar parts or portions to those used in FIG. 10. In FIG. 14, the reference numeral 211 designates a poly-Si film used as a wiring electrode. The reference numeral 123 designates an interlayer insulating film. The reference numeral 201 designates a first contact aperture. The first contact aperture 201 interconnects a transfer electrode assembly 106 (106a, 106b, 106c, 106d) and the poly-Si wiring electrode 211. The reference numeral 202 designates a second contact aperture. The second contact aperture 202 interconnects the poly-Si wiring electrode 211 and the metal wiring 107. It may be noted that the first and second contact apertures 201 and 202 are located at different areas, respectively.

According to this configuration shown in FIG. 14, the metal wiring 107 is not in direct contact with the transfer electrode 106 because the poly-Si transfer electrode assembly 106 is connected to the poly-Si wiring electrode 211 via the first contact aperture 201 and the poly-Si wiring electrode 211 is connected to the metal wiring 107 via the second contact aperture 202. The first and second contact apertures 201 and 202 are located at different areas spaced from each other in the horizontal plane. This configuration has proven to be effective in preventing occurrence of any dipping in potential.

However, the addition of poly-Si wiring electrode 211 and second contact aperture 202 causes increased complexity in wiring. The complicated wiring makes it very difficult to use the CCD register in constructing a CCD image sensor with highly condensed pixels. Increased surface irregularities under the metal wiring may damage the wiring and a covering layer. Any damage on the covering layer causes smearing to occur.

An object of the present invention is to provide a CCD image sensor, which has eliminated the above-mentioned drop in signal charge transfer without any increase in complexity of electrode configuration and without any increase in smear level.

SUMMARY OF THE INVENTION

According to one aspect of the present invention, there is provided a CCD image sensor comprising:

poly-Si transfer electrodes;

a photo-shield metal wiring;

contact apertures to establish connection between said poly-Si transfer electrodes and said metal wiring;

an N-type impurity layer that functions as a CCD channel through which electric charges are transferred; and N-type impurity regions having an impurity concentration lower than that of said N-type impurity layer, said N-type impurity regions being disposed within said N-type impurity layer and located below at least some of transfer electrodes in alignment with said contact apertures.

According to another aspect of the present invention, there is provided a CCD image sensor comprising;

poly-Si transfer electrodes;

a photo-shield metal wiring;

a contact aperture to establish connection between one of said poly-Si transfer electrodes and said metal wiring;

an N-type impurity layer;

diffusion separating regions separating said N-type impurity layer to define a CCD channel through which electric charges are transferred, said CCD channel having a centerline and extending along said centerline;

said contact aperture being located at a portion deviated from said centerline of said CCD channel viewing the CCD channel in its plan view.

According to specific aspect of the present invention, there is provided a CCD image sensor comprising:

first transfer electrodes of patterned first layer poly-Si film;

an insulating film on said first layer poly-Si film;

second transfer electrodes of patterned second layer poly-Si film that is deposed on said insulating film, each of said second transfer electrode having an overlapping portion that extends over an portion of the adjacent one of said first transfer electrodes;

a photo-shield metal wiring over said first and second transfer electrodes;

a first contact aperture to establish connection between one of said first transfer electrodes and said metal wiring;

a second contact aperture to establish connection between one of said second transfer electrodes and said metal wiring;

an N-type impurity layer below said first and second transfer electrodes;

diffusion separating regions separating said N-type impurity layer to define a CCD channel through which electric charges are transferred;

said first contact aperture being located at a portion on the adjacent one of said diffusion regions;

said second contact aperture being located at said overlapping portion of said second transfer electrode.

According to still another aspect of the present invention, there is provided a method of fabricating a CCD image sensor, comprising the steps of:

forming an N-type impurity layer on a semiconductor substrate;

forming a gate insulating film on said N-type impurity layer;

forming transfer electrodes on said gate insulating film;

forming an interlayer insulating film on said transfer electrodes;

forming a photo resist with a pattern on said interlayer insulating film;

forming contact apertures using said photo resist as a mask; and doping P-type impurity ion through said contact apertures using said photo resist and said interlayer insulating film as a mask, thereby to selectively form within said N-type impurity layer N-type impurity regions having an impurity concentration lower than that of said N-type impurity layer.

DESCRIPTION OF THE PREFERRED EMBODIMENTS

Figure 1:
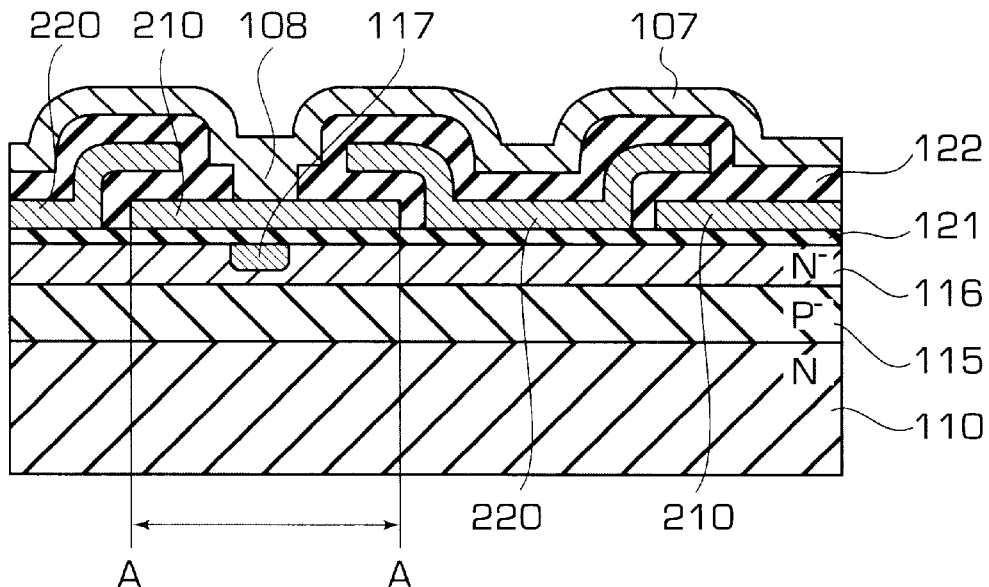
FIG. 1 is a cross section illustrating a first embodiment of a CCD register.
Figure 10:
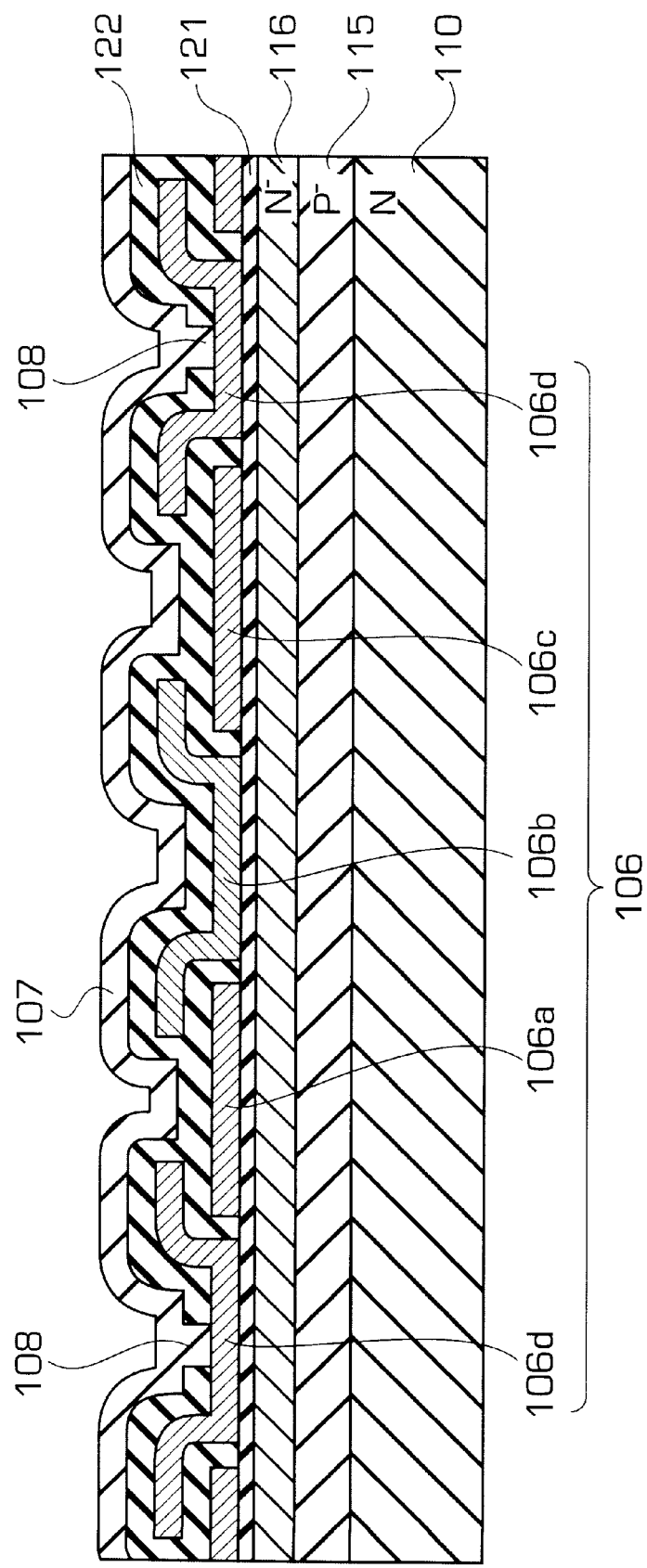
FIG. 10 is a cross section of the conventional CCD register.

Referring to FIGS. 1 to 7 of the accompanying drawings, the present invention is described along embodiments of a CCD image sensor. FIG. 1 is a cross section of the first embodiment of a CCD image sensor, illustrating a CCD channel. In FIG. 1, the same reference numerals as used in FIG. 10 are used to designate similar or like parts or portions to those in FIG. 10 for ease of comparison. The reference numeral 110 designates an N-type semiconductor insulator, on which a P$^-$-type well 115 is deposited. An N$^-$-type impurity layer 116 is deposited on the P$^-$-type well 115. A gate insulating film 121 is deposited on the N$^-$-type impurity layer 116. A first layer poly-Si film is patterned to form transfer electrodes 210 on the gate insulating film 121. A second layer poly-Si film is patterned to form transfer electrodes 220 on the gate insulating film 121. Each transfer electrode 220 is located between the adjacent two of the transfer electrodes 210 with its edge portions extending over edge portions of the transfer electrodes 210. An insulating film 122 is deposited to cover and fill gaps between the transfer electrodes 210 and 220. A metal wiring 107 is deposited on the insulating film 122 over the transfer electrodes 210 and 220. The metal wiring 107 has contact apertures, only one being shown at 108. The metal wiring 107 is connected to transfer electrodes 210 and 220 via the contact apertures. In the illustrated example, the contact aperture 108 allows direct connection of the metal wiring 107 with the transfer electrode 210.

In FIG. 1, an N$^{--}$impurity region 117 is formed within the surface of the N$^-$-type impurity layer 116. The impurity concentration the N$^{--}$impurity region 117 is lower than that of the N$^-$-type impurity layer 116. The N$^{--}$impurity region 117 is located below the transfer electrode 210 and aligned with the contact aperture 108 opening to this transfer electrode 210. Using the insulating film 122 as a mask, the P-type impurity of boron is doped by ion implantation into the surface of the N$^-$-type impurity layer 116 via the contact aperture 108 to form the N$^{--}$impurity region 17. The N$^{--}$impurity region 117 within the CCD channel functions to eliminate or at least reduce a dipping in potential that would occur due to the contact aperture 108. The boron doped N$^{--}$impurity regions 117 are located below all of the contact apertures 108 in alignment therewith, respectively. If desired, the N$^{--}$impurity regions 117 may be located below selected one of the contact apertures 108 in alignment therewith.

The provision of the N$^{--}$impurity regions 117 has proven to be effective in eliminating or at least reducing dipping in potential due to the contact apertures 108, thereby preventing charges from being left in such dipping portions and avoiding a drop in transfer efficiency.

Figure 2:
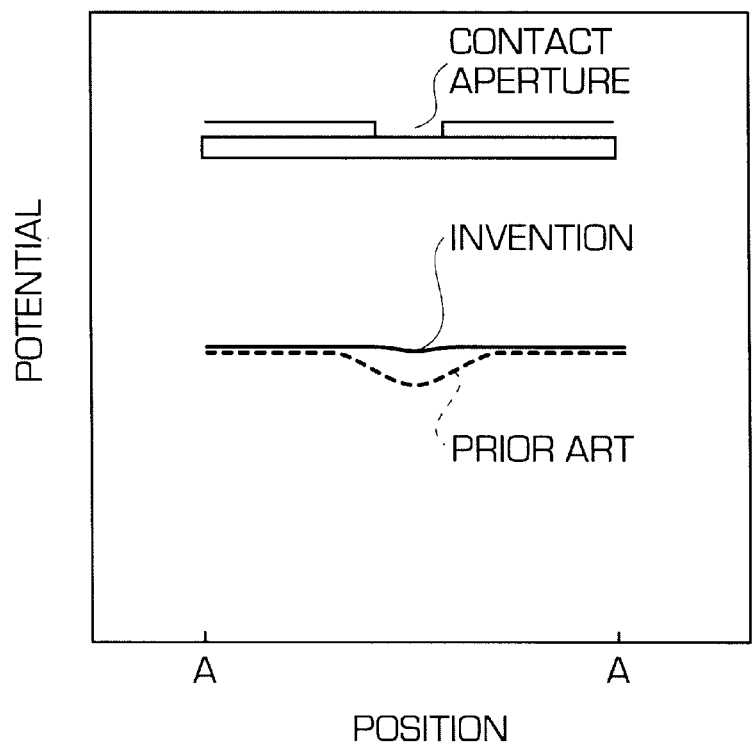
FIG. 2 shows a potential distribution in the first embodiment.

In this embodiment, tungsten is used as the metal wiring 107. If tungsten is used, a dipping in potential of about 1 volt is observed. In this case, ion implantation is used to introduce boron into the surface of the N -type impurity layer 116 to form boron concentration of about $3 \times 10^{11}/\text{cm}^2$. FIG. 2 shows distribution of potential of the transfer electrode 210 along a distance as indicated by A—A in FIG. 1. As is readily understood from FIG. 2, the introduction of appropriate amount of boron reduced dipping in potential.

Figure 3:
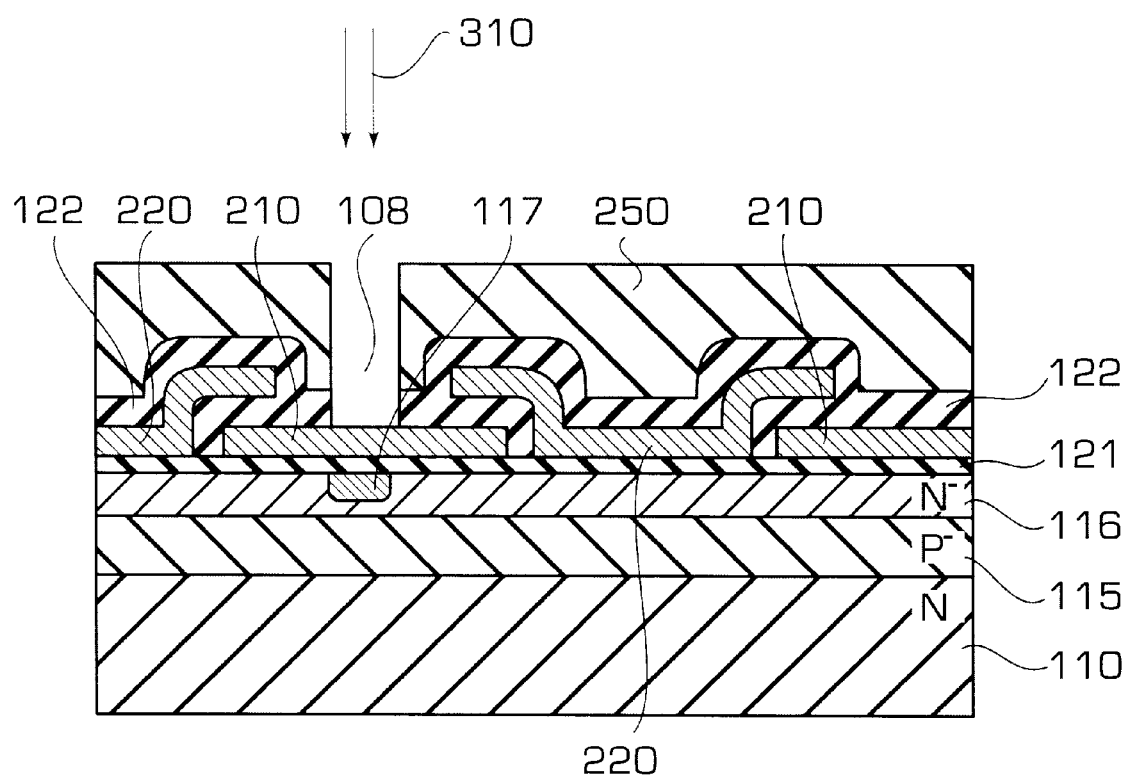
FIG. 3 illustrates a processing step in fabrication of the CCD register.

FIG. 3 is a cross section illustrating a process step of adding boron to form the N$^-$-impurity regions 117. Using a photo resist 250 with a master pattern as a mask, the insulating film 122 is patterned to form contact apertures 108. Ion implantation technique is used to introduce P-type impurity of boron ion 310 into the surface of the N$^-$-type impurity layer 116 below the poly-Si transfer electrodes via the contact apertures 108. In this manner, the N$^-$-impurity regions 117 are formed within the surface of the N$^-$-type impurity layer 116. In this embodiment, the poly-Si transfer electrodes have about 0.2 μm in thick. The gate insulating film 121 has about 700 angstroms in thick. In this case, ion implantation of boron ion at acceleration voltage 100 to 150 KV is preferred to form the N$^{--}$impurity regions 117 within the N$^-$type impurity layer 116.

The amount of boron to be doped determines the flatness of the bottom of potential well below transfer electrode. This amount is dependent on the thickness of the gate insulating film 121 and the impurity concentration of the N$^-$-type impurity layer 116. If this amount is larger than the appropriate level, the potential distribution below the contact aperture protrudes to form a barrier. This protrusion does not have any ill effect on the transfer of charges. However, if this amount is excessively larger the necessary, the maximum amount of electric charges that can be transferred drops. Thus, the amount of boron must be determined taking the above mentioned factors into account.

Although in this embodiment tungsten is used as the metal wiring, other material may be used as the metal wiring. The potential dipping due to the provision of contact aperture varies in depth depending on the thickness of the poly-Si transfer electrode and the material of the metal wiring. Thus, the amount of boron to be implanted must be determined taking such variations in depth of the potential dipping into account.

Figure 4:
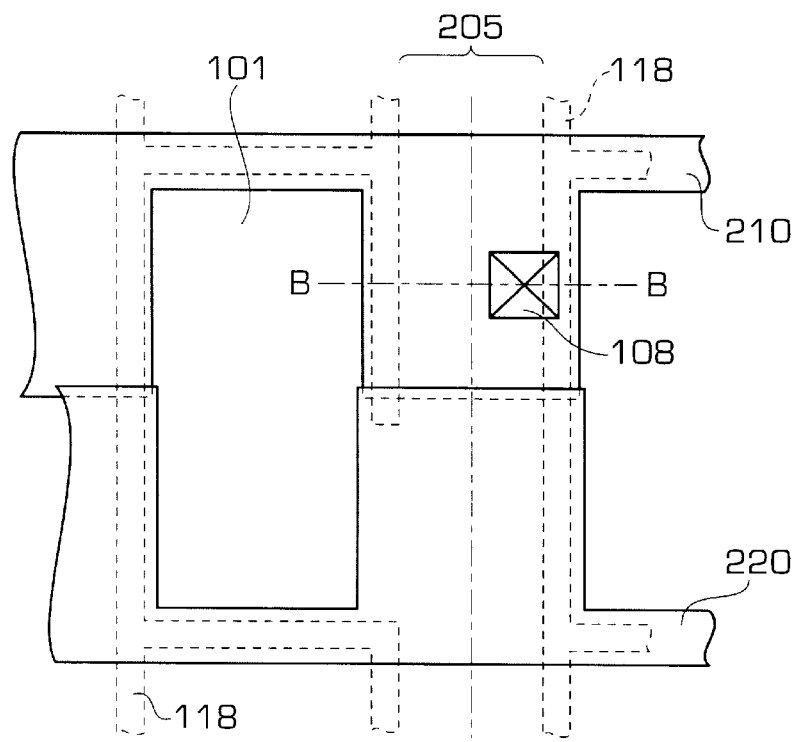
FIG. 4 is a plan view illustrating a second embodiment of a CCD register.
Figure 11:
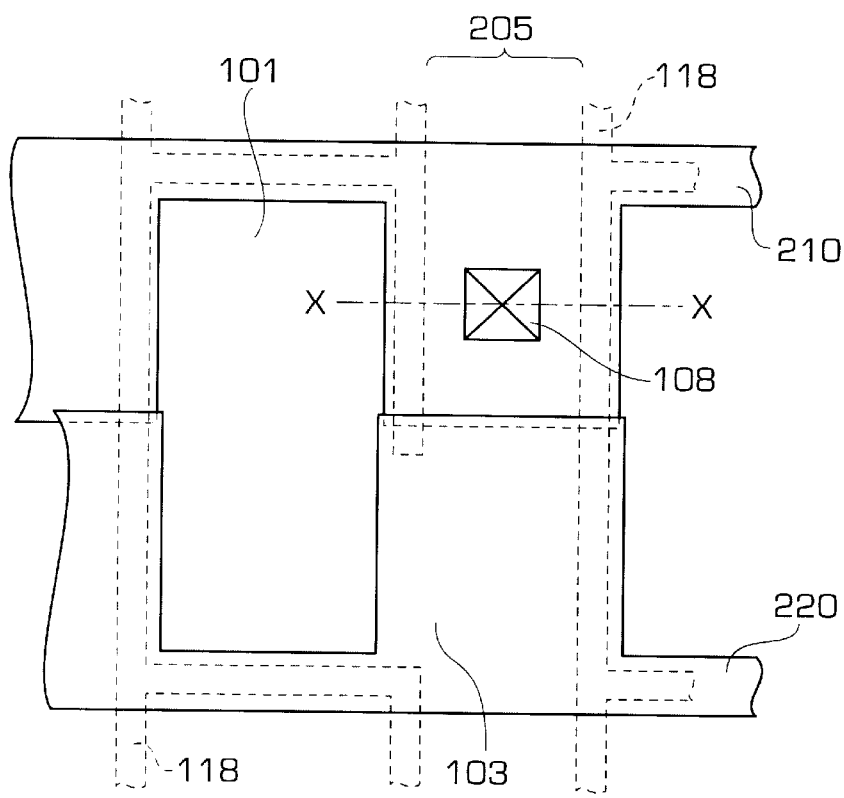
FIG. 11 is a plan view of the conventional electrode configuration discussed before.
Figure 12:
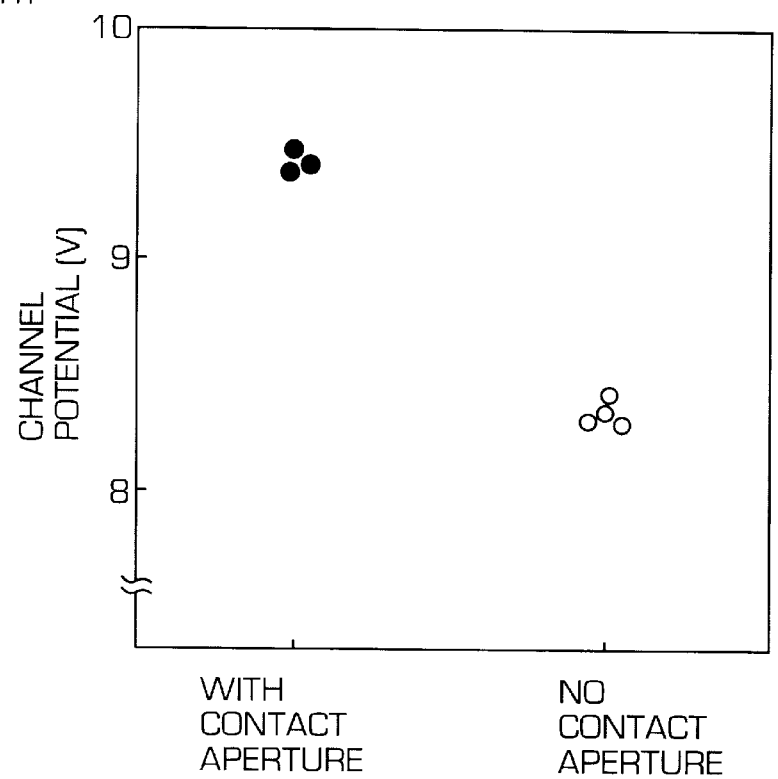
FIG. 12 shows the results of the experiment to compare the difference in potential between a CCD resister without a contact aperture and another CCD register with a contact aperture.
Figure 13:
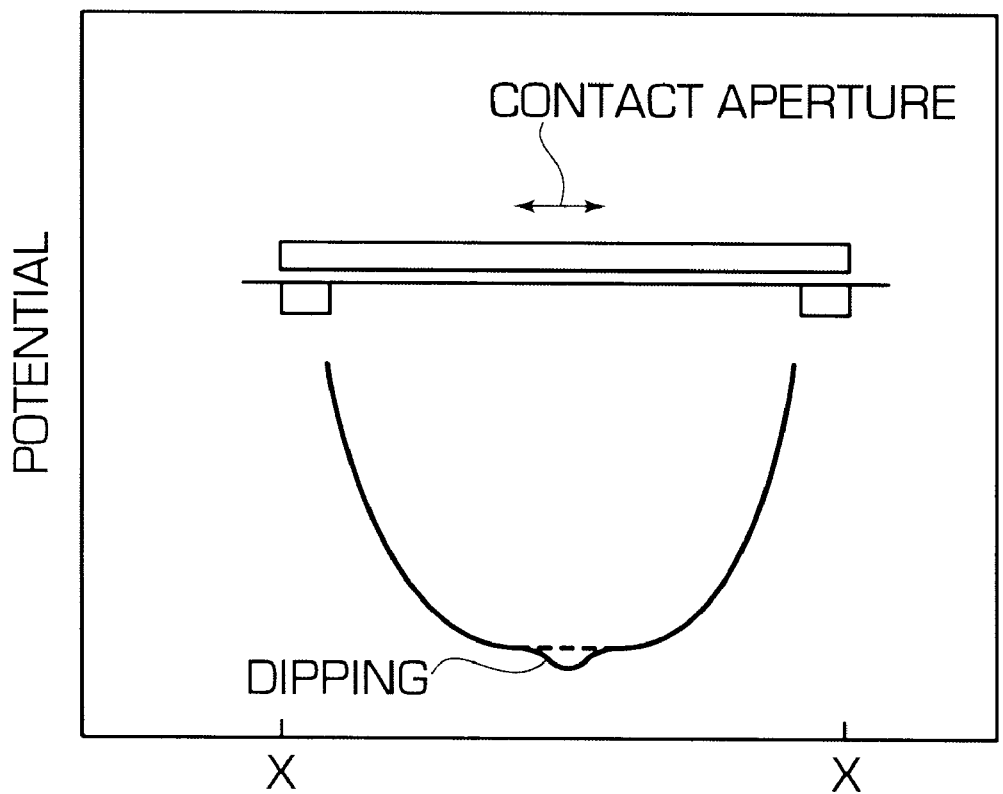
FIG. 13 illustrates distribution of potential along a cross section taken through the line X—X in FIG. 11.
Figure 14:
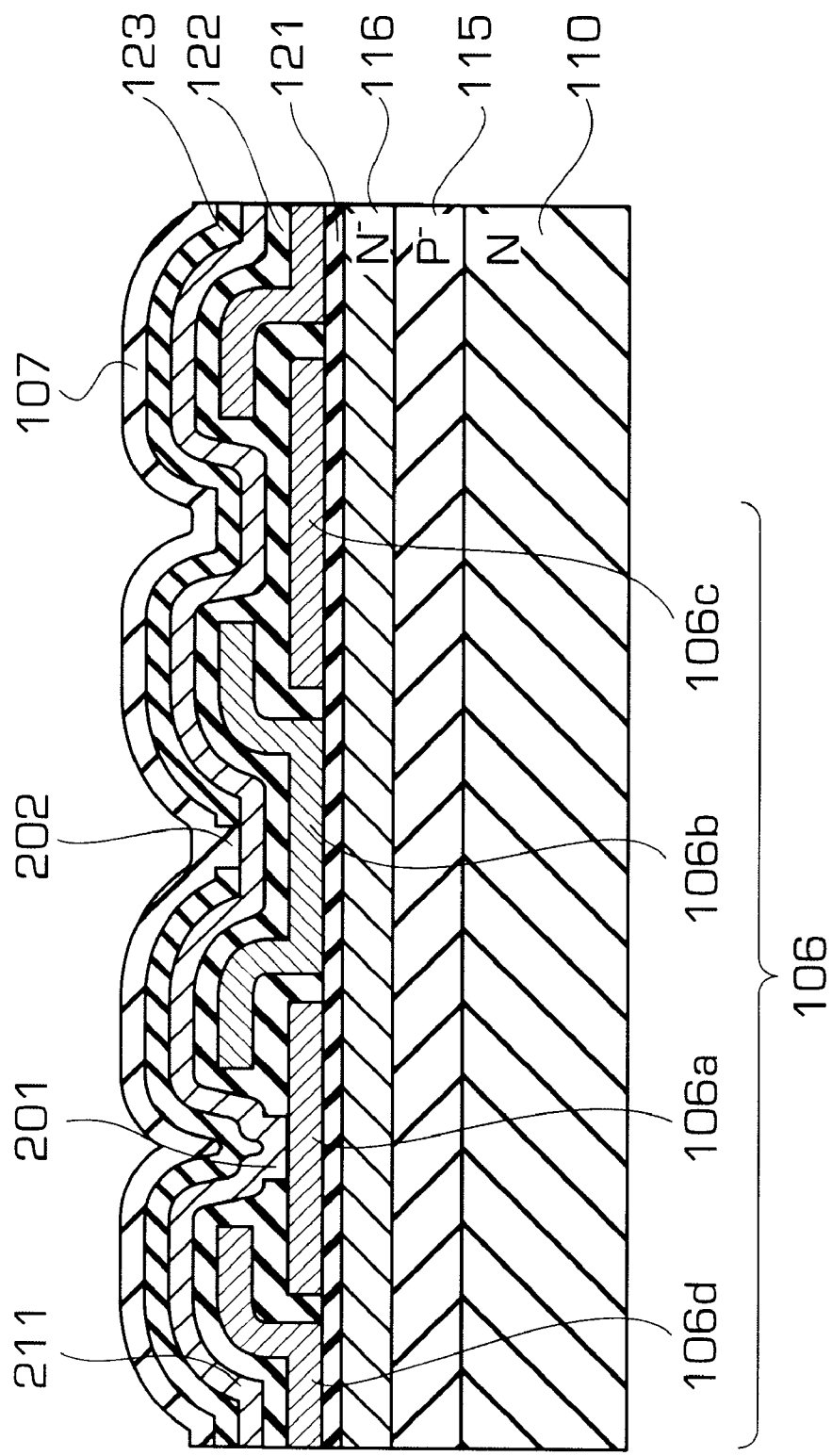
FIG. 14 is a cross section illustrating electrode configuration of other conventional CCD register.

Referring to FIG. 4, the second embodiment according to the present invention is described. FIG. 4 is a plan view of configuration of a photodiode and a vertical CCD channel. Transfer electrodes 210, 220 and separating diffusion region 118 shown in FIG. 4 are substantially the same as those shown in FIG. 11. According to this second embodiment, a contact aperture 108 is different from its counterpart in FIG. 11 in its location and it is deviated to the right, viewing in FIG. 4, from a centerline of a CCD channel 205. The centerline is illustrated by one-dot chain line. Specifically, in this example, the contact aperture 108 is deviated to such an extent that a portion of the contact aperture 108 overlaps a portion of the adjacent diffusion region 118. Implantation of boron is not conducted in this embodiment.

Figure 5:
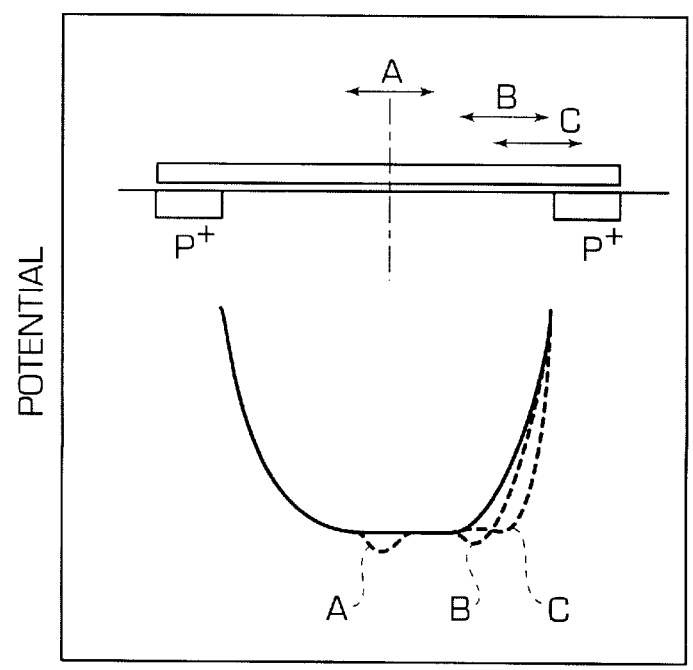
FIG. 5 shows a potential distribution in the second embodiment.

FIG. 5 illustrates potential distribution along cross section taken through the line B—B in FIG. 4. The concentration of $N^-$-type impurity concentration of the CCD channel 205 is far lower than that of $P^+$-type diffusion region 118 by about two figures. Depletion region spreads toward the side where the $N^-$-type impurity concentration is high. Thus, the potential within the CCG channel 205 is subject to a rapid change in the proximity of the diffusion region 118. In FIG. 5, the fully drawn line illustrates the potential unless any contact aperture is provided. A dipping in potential as illustrated by dotted line A appears if the contact aperture 108 is located on the centerline of the CCD at a position A.

If the contact aperture 108 is located at a point B in contact with the edge of adjacent $P^+$-type diffusion region 118, the depth of the potential dipping B decreases as a result of its superimposition with the rapid potential change at the edge of the diffusion region 118. If the contact aperture 108 is located at a point C in overlapping relation with the diffusion region 118, the potential dipping C greatly decreases or disappear.

The gradient at which a change in depth of dipping against a change in contact aperture decreases as the size of the contact aperture increases. According to the simulation, if the contact aperture of 0.4 microns is etched in contact with the adjacent $P^+$-type diffusion region 118, the potential dipping has mostly disappeared. Thus, it is advantageous to use contact apertures with small size. The rapid potential change occurring in the proximity of the diffusion region 118 largely depends on difference in impurity concentration between $N^-$-type impurity layer of the CCD channel and $P^+$-type diffusion region. Thus, the impurity concentration must be carefully designed.

In this second embodiment, the contact aperture 108 is deviated from the centerline to the right. The direction of deviation is not limited to the right and the contact aperture 108 may be deviated to the left viewing in FIG. 4.

Figure 6:
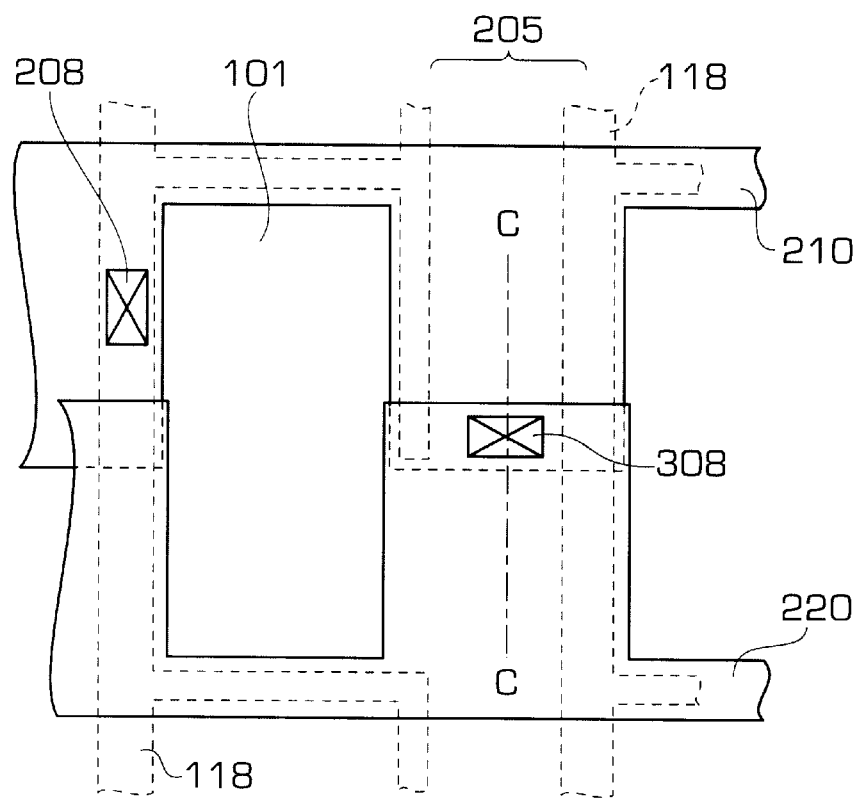
FIG. 6 is a plan view illustrating a third embodiment of a CCD register.

Referring to FIG. 6, the third embodiment according to the present invention is described. FIG. 6 is a plan view of configuration of a photodiode and a vertical CCD channel. The same reference numerals as used in FIG. 4 are used in FIG. 6 to designate similar or like parts or portion to those of FIG. 4. In FIG. 6, the reference numeral 208 designates a first contact aperture for connection between a transfer electrode 210 of the first layer poly-Si film (see FIG. 1) and a metal wiring, not shown. The reference numeral 308 designates a second contact aperture for connection between a transfer electrode 220 of the second layer poly-Si film and the metal wiring.

The first contact aperture 208 is located above and opens to diffusion region 118. This provision of the contact aperture 208 does not cause any change in potential within the CCD channel. The second contact aperture 308 is located above and opens to the transfer electrode 220 at an overlapping portion thereof that extends over the adjacent transfer electrode 210.

Figure 7:
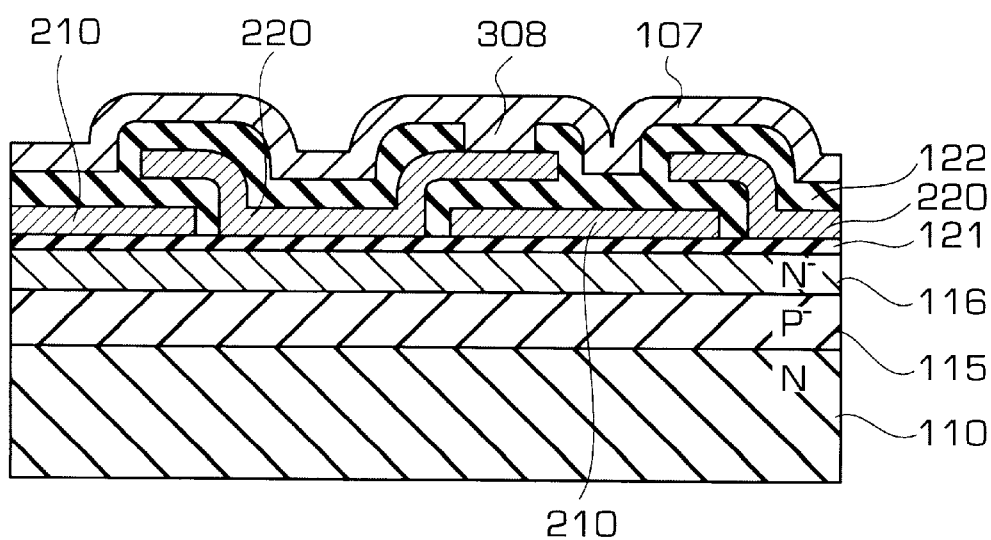
FIG. 7 is a cross section taken through the line C—C in FIG. 6.
Figure 8:
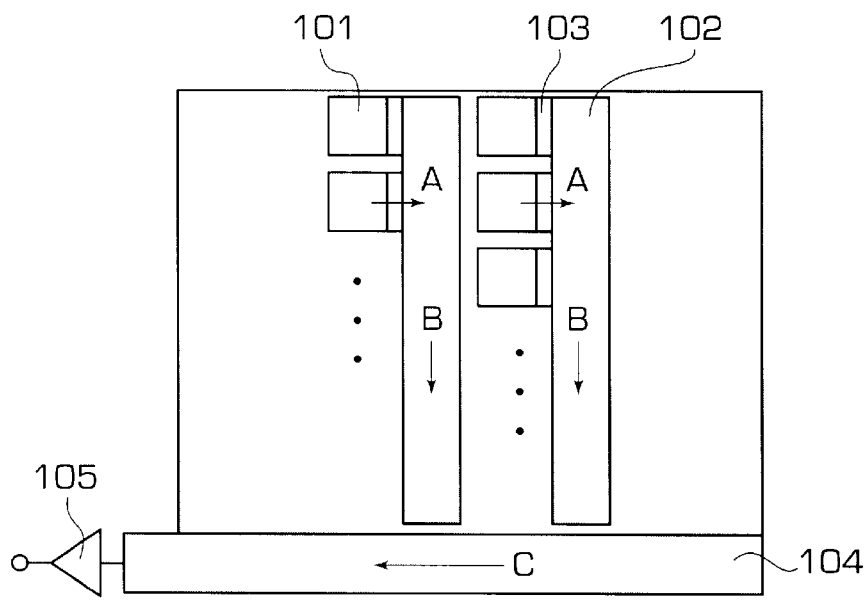
FIG. 8 shows the conventional two-dimensional solid state image sensor discussed before.
Figure 9:
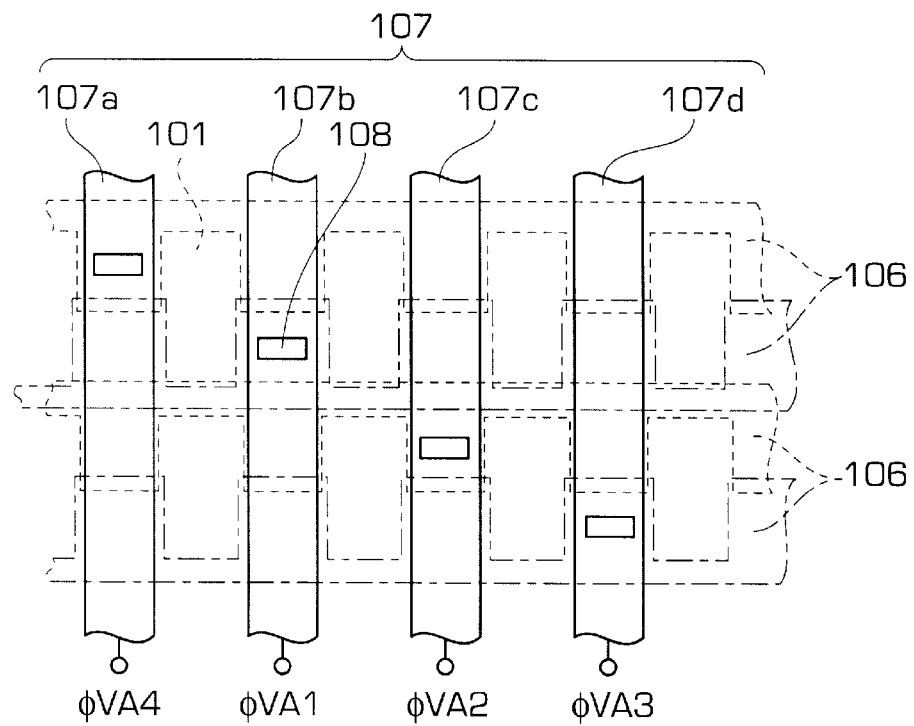
FIG. 9 shows the electrode configuration of the conventional image sensor.

FIG. 7 is a cross section taken through the line C—C in FIG. 6. The transfer electrode 210 is positioned below the transfer electrode 220 to which the contact aperture 308 opens. Thus, the connection between metal wiring 107 and the transfer electrode 220 by the contact aperture 308 causes no change in potential within the CCR channel.

The contact aperture 308 for connection with the transfer electrode 220 may be located above the adjacent diffusion region 118.

The feature described in connection with the first embodiment may be implemented in the second or third embodiment. That is, the $N^{--}$impurity regions 117 may be formed in the second or third embodiment.

From the preceding embodiments, it will be appreciated that, without complicated structure under the metal wiring, the potential dipping in the CCD channel due to connection between the poly-Si transfer electrode and the metal wiring has been eliminated. Thus, the transfer efficiency can be maintained at satisfactorily high level without smearing.

What is claimed is:

1. A CCD image sensor comprising:

poly-Si transfer electrodes;

a photo-shield metal wiring;

contact apertures to establish connection between said poly-Si transfer electrodes and said metal wiring;

an N-type impurity layer that functions as a CCD channel through which electric charges are transferred; and N-type impurity regions having an impurity concentration lower than that of said N-type impurity layer, said N-type impurity regions being disposed within said N-type impurity layer and located below at least some of transfer electrodes in alignment with said contact apertures.

2. A CCD image sensor comprising;

poly-Si transfer electrodes;

a photo-shield metal wiring;

a contact aperture to establish connection between one of said poly-Si transfer electrodes and said metal wiring;

an N-type impurity layer;

diffusion separating regions separating said N-type impurity layer to define a CCD channel through which electric charges are transferred, said CCD channel having a centerline and extending along said centerline;

said contact aperture being located at a portion deviated from said centerline of said CCD channel viewing the CCD channel in its plan view.

3. The CCD image sensor as claimed in claim 2, wherein said contact aperture is in contact with the adjacent one of said diffusion regions.

4. The CCD image sensor as claimed in claim 2, wherein said contact aperture is in overlapping relation with the adjacent one of said diffusion regions.

5. A CCD image sensor comprising:

first transfer electrodes of patterned first layer poly-Si film;

an insulating film on said first layer poly-Si film;

second transfer electrodes of patterned second layer poly-Si film that is deposed on said insulating film, each of said second transfer electrode having an overlapping portion that extends over an portion of the adjacent one of said first transfer electrodes;

a photo-shield metal wiring over said first and second transfer electrodes;

a first contact aperture to establish connection between one of said first transfer electrodes and said metal wiring;

a second contact aperture to establish connection between one of said second transfer electrodes and said metal wiring;

an N-type impurity layer below said first and second transfer electrodes;

diffusion separating regions separating said N-type impurity layer to define a CCD channel through which electric charges are transferred;

said first contact aperture being located at a portion on the adjacent one of said diffusion regions;

said second contact aperture being located at said overlapping portion of said second transfer electrode.

* * * * *